(12) United States Patent
Shieh et al.

(10) Patent No.: US 8,835,323 B1
(45) Date of Patent: Sep. 16, 2014

(54) METHOD FOR INTEGRATED CIRCUIT PATTERNING

(71) Applicant: Taiwan Semiconductor Manufacturing Company, Ltd., Hsin-Chu (TW)

(72) Inventors: Ming-Feng Shieh, Yongkang (TW); Ru-Gun Liu, Zhubei (TW); Tsai-Sheng Gau, HsinChu (TW); Shih-Ming Chang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/911,334

(22) Filed: Jun. 6, 2013

Related U.S. Application Data (60) Provisional application No. 61/784,608, filed on Mar. 14, 2013.

(51) Int. Cl.
  *H01L 21/311* (2006.01)
  *H01L 21/306* (2006.01)
  *H01L 21/308* (2006.01)

(52) U.S. Cl.
  CPC .............. *H01L 21/3086* (2013.01); *H01L 21/30625* (2013.01)
  USPC .............. 438/700; 438/689; 216/41

(58) Field of Classification Search
  USPC ..................... 438/700, 689; 216/41
  See application file for complete search history.

(56) References Cited

U.S. PATENT DOCUMENTS

| | | | |
|---|---|---|---|
| 7,862,962 B2 | 1/2011 | Shieh et al. | |
| 7,989,355 B2 | 8/2011 | Shieh et al. | |
| 8,039,179 B2 | 10/2011 | Shieh et al. | |
| 8,110,466 B2 | 2/2012 | Shieh et al. | |
| 8,241,823 B2 | 8/2012 | Shieh et al. | |
| 8,524,604 B2 * | 9/2013 | Jung .......................... | 438/696 |
| 2012/0100673 A1 | 4/2012 | Shieh et al. | |

* cited by examiner

*Primary Examiner* — Roberts Culbert
(74) *Attorney, Agent, or Firm* — Haynes and Boone, LLP (57) ABSTRACT

A method of forming a target pattern includes forming a mandrel pattern on a substrate, the mandrel pattern having a line with a first dimension in a first direction and a second dimension in a second direction; forming a spacer around the mandrel pattern, the spacer having a first width; forming a cut pattern over the mandrel pattern and the spacer wherein the cut pattern partially overlaps the spacer on both sides of the line in the first direction; etching the mandrel pattern using the cut pattern as an etch mask, thereby defining a plurality of openings with sidewalls of the spacer, the cut pattern, and a portion of the mandrel pattern underneath the cut pattern; and reducing the first width of the spacer thereby to enlarge the plurality of openings.

20 Claims, 11 Drawing Sheets

METHOD FOR INTEGRATED CIRCUIT PATTERNING

This patent claims the benefit of U.S. Prov. No. 61/784,608 entitled "Spacer Width Tuning for Integrated Circuit Design" filed Mar. 14, 2013, herein incorporated by reference in its entirety. This patent also hereby incorporates by reference U.S. Prov. No. 61/777,736 entitled "A Method of Fabricating A FinFET Device" filed Feb. 14, 2013.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, as the critical dimension (CD) of a feature is scaled down, overlay errors become problematic when performing a fin cut process while fabricating a fin field effect transistor (FinFET) device. For example, a spacer technique can be used for doubling the exposed pattern. That is, the pitch of a final pattern is reduced to only half compared with the first exposed pattern. A typical spacer technique uses two masks. The first one defines a mandrel pattern in a first exposure and the second one defines a cut pattern in a second exposure. The cut pattern removes unwanted portions of the mandrel pattern, a derivative, or both. The final pattern includes the mandrel pattern plus the derivative but not the cut pattern. Some process schemes allow the cut pattern to land on the spacer, to be confined by the spacer. As a result, an overlay budget and CD variation budget of the cut pattern is about half of the spacer width. In some occasions, only one feature at a minimum pitch will be cut. Therefore, a very small cut feature is needed. The pattern fidelity of such a small feature is often not desirable, and the total budget for overlay and CD variation is insufficient.

Accordingly, what is needed is a method to extend the overlay budget and CD variation budget of cut patterns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2a-9c are top and cross sectional views of forming a target pattern according to the method of FIG. 1.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
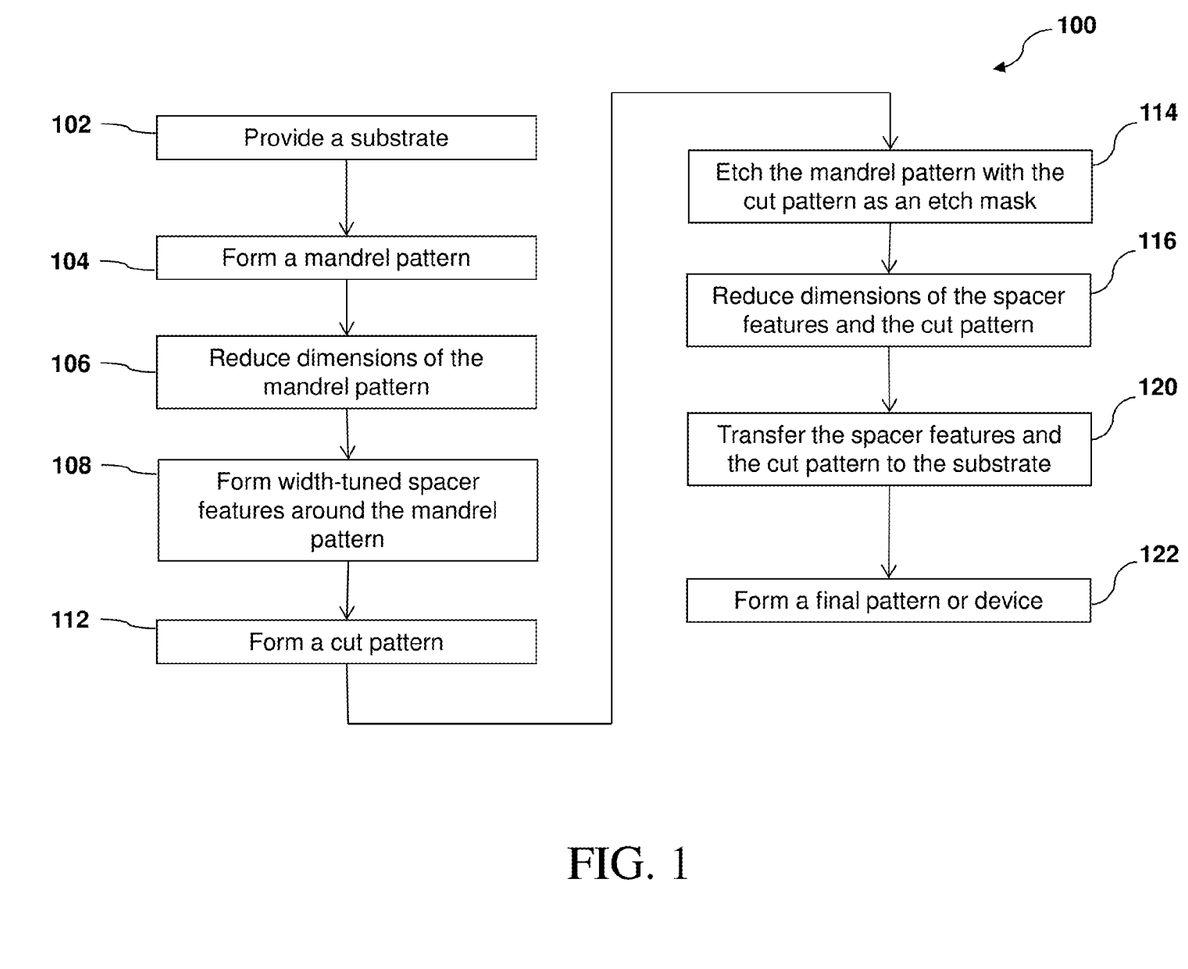
FIG. 1 is a flow chart of a method of forming a target pattern or device on a substrate for implementing one or more embodiments.

Referring now to FIG. 1, a flow chart of a method 100 for forming a target pattern is illustrated. It is understood that additional operations can be provided before, during, and after the method 100, and some operations described can be replaced, eliminated, or moved around for additional embodiments of the method. The method 100 will be further described below. The method 100 is an example, and is not intended to limit the present disclosure beyond what is explicitly recited in the claims.

FIGS. 2a-9c show a process flow for a lithographic-spacer process with cut features according to one embodiment of the method 100. In each of FIGS. 2a-9c, the figure designated with the suffix "a" (e.g., FIG. 2a) includes a dotted line that defines cross sectional views for the figures designated with the suffix "b," "c," and so on.

The method 100 begins at operation 102 by providing a substrate. The substrate includes one or more layers of material or composition. Referring to FIGS. 2a-2d, in the present embodiment, the substrate includes a dielectric layer 202, an inter-layer dielectric (ILD) layer 204, a first nitrogen-free anti-reflection coating (NFARC) layer 206, a hard mask layer 208, a second NFARC layer 210, a first bottom material layer 212, and a first middle material layer 214. In one embodiment, the ILD layer includes an extreme low-k dielectric (ELK) material, the hard mask layer includes titanium nitride, the NFARC material is selected from the group consisting of silicon oxide, silicon oxygen carbide, and plasma enhanced chemical vapor deposited silicon oxide, the bottom material includes a bottom anti-reflection coating polymeric material, and the middle material includes silicon containing polymer.

Figure 2A:
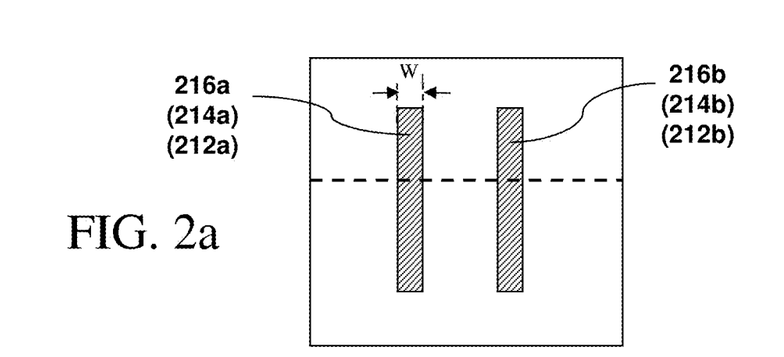
Figure 2B:
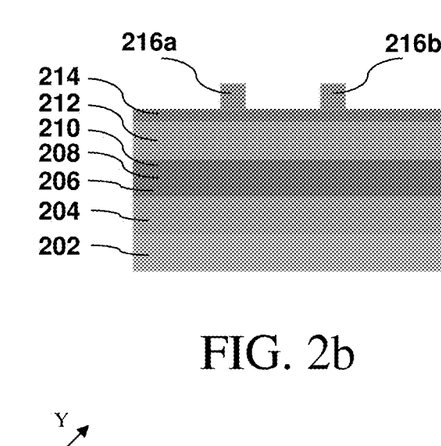
Figure 2C:
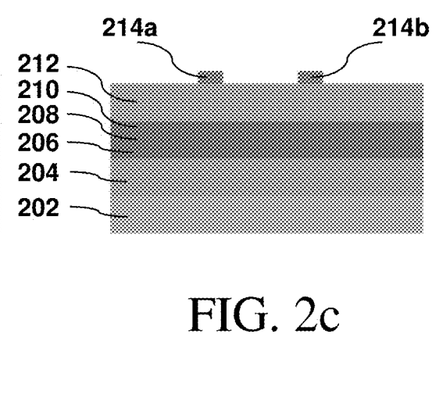
Figure 2D:
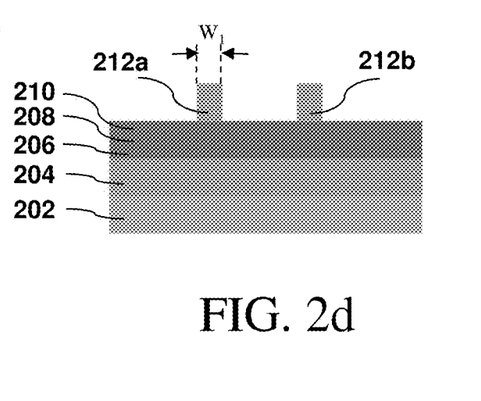

The method 100 proceeds to operation 104 by forming a mandrel pattern over the substrate through a suitable process, such as a process including a lithography process and an etching process. Referring again to FIGS. 2a-2d, in the present embodiment, a mandrel pattern including two mandrel lines, 212a and 212b, is formed over layer 210 of the substrate, the mandrel line 212a having a dimension $W_1$ in direction X. FIG. 2b shows a first resist layer being patterned to have patterns 216a and 216b using a lithography process, which includes photoresist coating, soft baking, exposing, post-exposure baking, developing, and hard baking in one example. FIG. 2c shows layer 214 being etched with the resist patterns 216a and 216b as an etch mask and the resist patterns 216a and 216b being removed thereafter. FIG. 2d shows layer 212 being etched with the patterned layer 214 as an etch mask and the patterned layer 214 being removed thereafter, thereby forming the mandrel pattern including the two mandrel lines, 212a and 212b.

The etching process in the above operation may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., $HBr$ and/or $CHBR_3$), an iodine-containing gas, other suitable gases and/or plasmas, and/or combinations thereof.

Figure 3A:
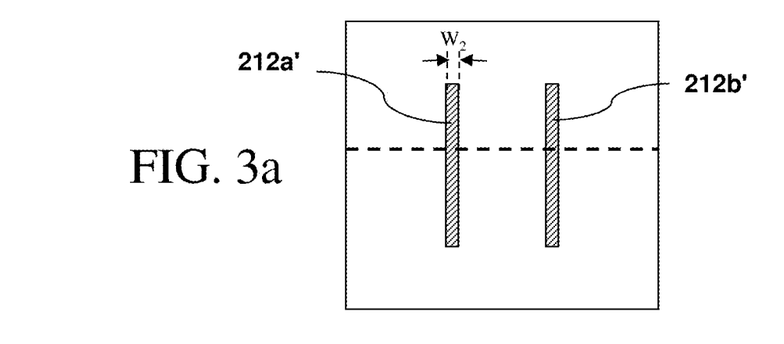
Figure 3B:
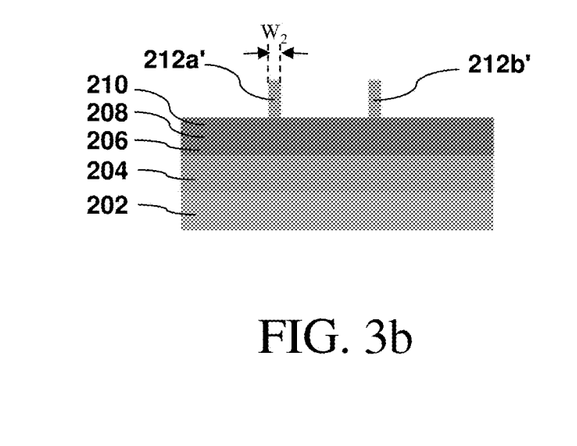

The method 100 proceeds to operation 106 by reducing dimensions of the mandrel pattern. Referring to FIGS. 3a, 3b, in the present embodiment, dimensions of the two mandrel lines in direction X are reduced, resulting in two reduced-width mandrel lines, 212a' and 212b'. In one example, $W_2$ is about one half of $W_1$. One way of reducing the dimensions of the mandrel lines is via a wet or dry etching process.

The method 100 proceeds to operation 108 by forming spacer features around the mandrel patterns, wherein the width of the spacer features is tuned to extend the overlay budget and CD variation budge of cut patterns in a later operation. The spacer features include one or more material different from the mandrel pattern. In one embodiment, the spacer features may include a dielectric material, such as titanium nitride, silicon nitride, or titanium oxide. The spacer features can be formed by various processes, including a deposition process and an etching process. For example, the deposition process includes a chemical vapor deposition (CVD) process or a physical vapor deposition (PVD) process. For example, the etching process includes an anisotropic etch such as plasma etch.

Figure 4A:
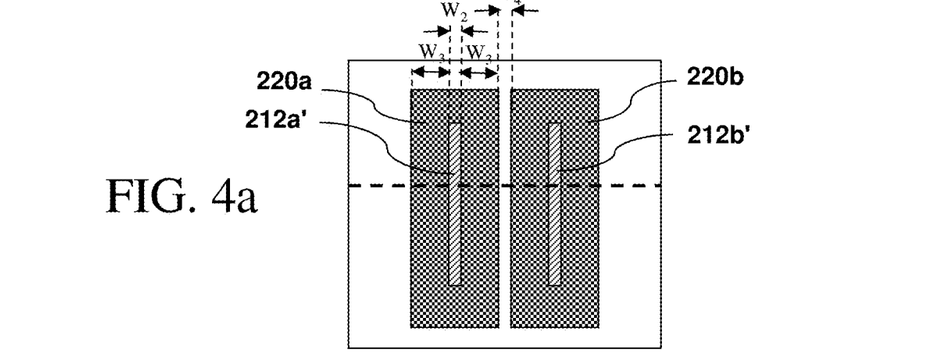
Figure 4B:
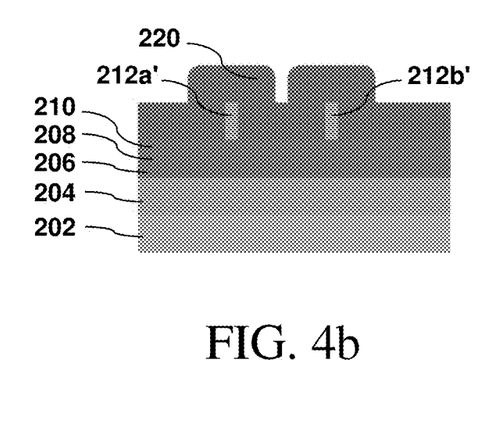
Figure 4C:
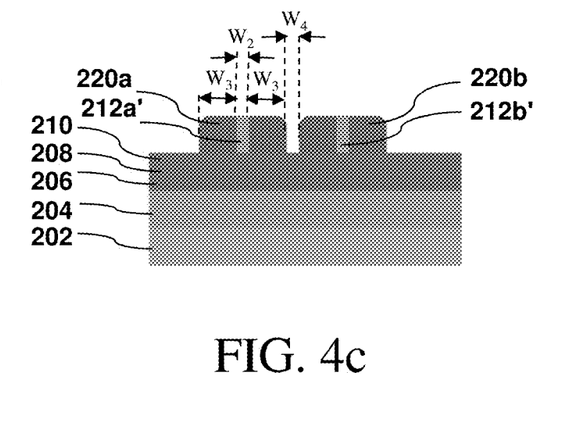

Referring now to FIGS. 4a-4c, in the present embodiment, two spacers, 220a and 220b, are formed over layer 210 and around the two mandrel lines, 212a' and 212b', respectively. FIG. 4b shows a spacer material 220 being deposited over the mandrel lines and over layer 210. FIG. 4c shows the spacer material disposed on top of the mandrel lines and over layer 210 being removed while the spacer material on sidewalls of the mandrel lines remains, resulting in two spacers, 220a and 220b. The spacer 220a has a width of $W_3$ in direction X. In the present embodiment, $W_3$ is at least two and half times greater than $W_2$. In one example, $W_3$ is about three times greater than $W_2$. FIG. 4c also shows a gap between the two spacers having a dimension $W_4$ in direction X, such as according to a design requirement or minimum feature spacing set out in the design rules.

The method 100 proceeds to operation 112 by forming a cut pattern over both the mandrel pattern and the space features wherein the cut pattern partially overlaps the spacer features. This can be done through a suitable process including deposition, a lithography process, and an etching process.

Figure 5A:
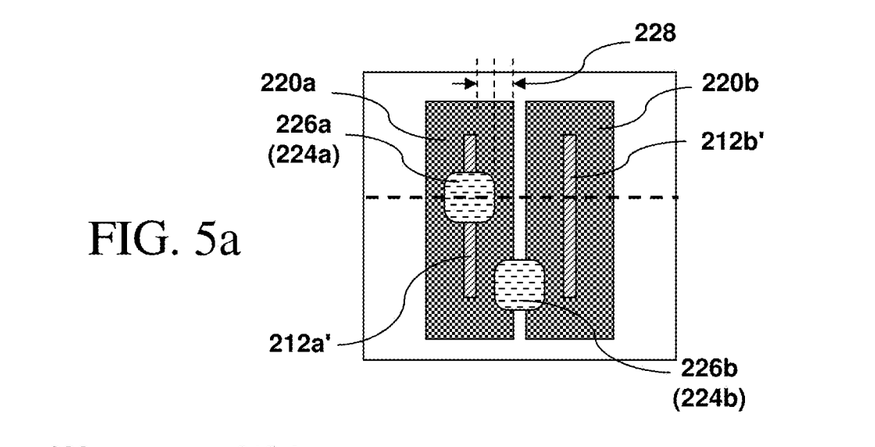
Figure 5B:
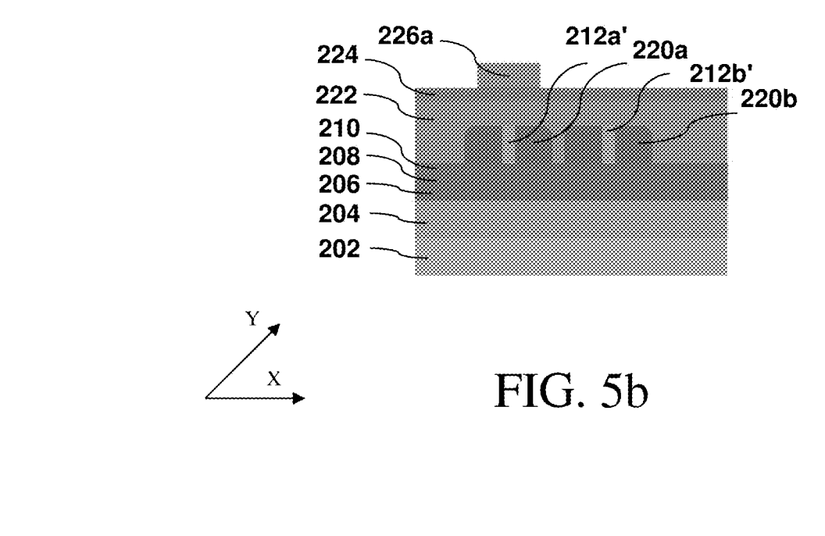
Figure 5C:
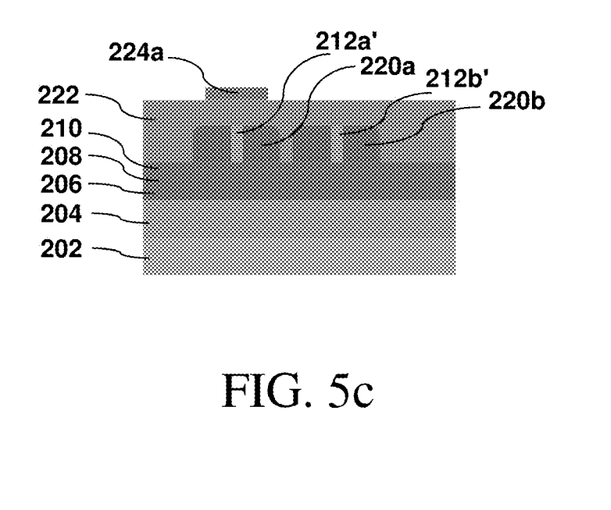

Referring now to FIGS. 5a-5c, in the present embodiment, a cut pattern with two cut features, 226a (224a) and 226b (224b), are formed. The cut feature 226a (224a) is formed directly over the mandrel line 212a', and the cut feature 226b (224b) is formed over the gap between the two spacers. As with all features, the cut features have to conform to design rules and other constraints. In the present embodiment, the edge of the cut features must extend beyond the feature being cut by a predetermined amount. As shown in FIG. 5a, the cut feature 226a (224a) must extend beyond the reduced-width mandrel line 212a' underneath, but cannot extend into the gap between the two spacers. Therefore, an error budget (EB) 228, in which the edge of the cut feature must reside, is confined to the width of the spacers which has been tuned in operation 108 to extend this EB.

Referring to FIG. 5b, in the present embodiment, a second bottom material (BL2) layer 222 is formed over both the spacer features and the mandrel lines and on layer 210 of the substrate, a second middle material (ML2) layer 224 is formed over the layer 222, and a second photoresist (PR2) layer is patterned with the cut features 226a and 226b. FIG. 5c shows layer 224 being etched with the patterned PR2 layer as an etch mask and the patterned PR2 layer being removed thereafter, thereby forming the two cut features, 224a and 224b.

The method 100 proceeds to operation 114 by etching the mandrel pattern with the cut pattern as an etch mask while the spacer features remain, thereby forming a plurality of openings in and around the spacer features.

Figure 6A:
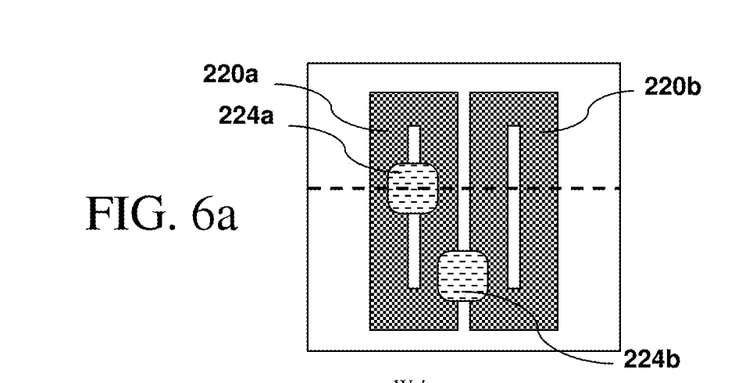
Figure 6B:
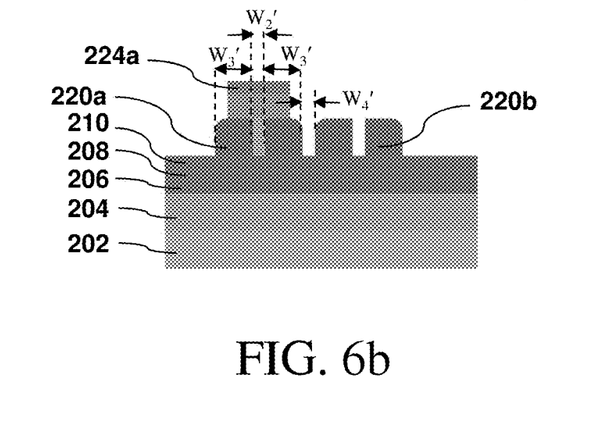

Referring to FIGS. 6a, 6b, in the present embodiment, layer 222 and the reduced-width mandrel lines are etched with the cut features 224a and 224b as an etch mask while the spacer features remain. This can be done via an etching process selectively tuned to remove the layer 222 material and the mandrel line material. The spacer features remain substantially unchanged during the etching process. That is, dimensions $W_2'$, $W_3'$, and $W_4'$ in FIG. 6b remain about the same as dimensions $W_2$, $W_3$, and $W_4$ in FIG. 4c respectively.

The method 100 proceeds to operation 116 by reducing the dimensions of the spacer features and the cut pattern thereby enlarging the openings in and around the spacer features. This can be done via an etching process such as an anisotropic etching process.

Figure 7A:
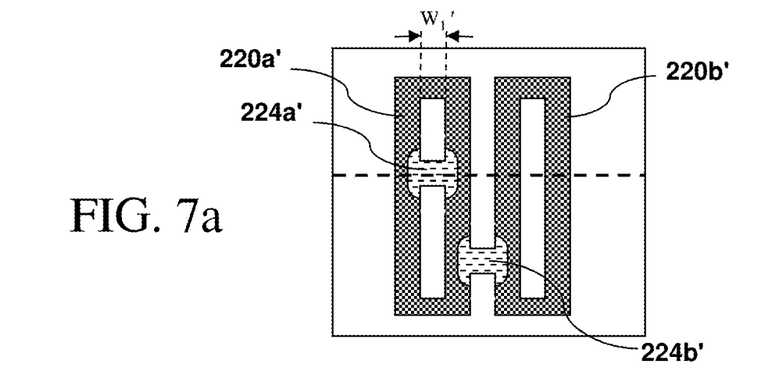
Figure 7B:
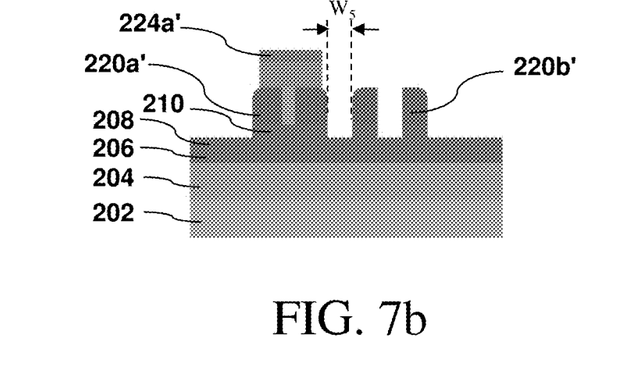

Referring now to FIGS. 7a, 7b, in the present embodiment, layer 210 is etched with both the spacer features and the cut features as an etch mask and with layer 208 as an etch stop layer. The etching process is selectively tuned to have large etching bias thereby reducing the dimensions of the spacer features and the cut features during the etching process. As a result, the openings within the spacers and the gap between the spacers are enlarged. In one example, dimension $W_1'$ of the spacer feature 220a' in FIG. 7a is about the same as dimension $W_1$ in FIG. 2a.

The method 100 proceeds to operation 120 by transferring the spacer features and the cut pattern to the substrate through a suitable process, such as an anisotropic etching process.

Figure 8A:
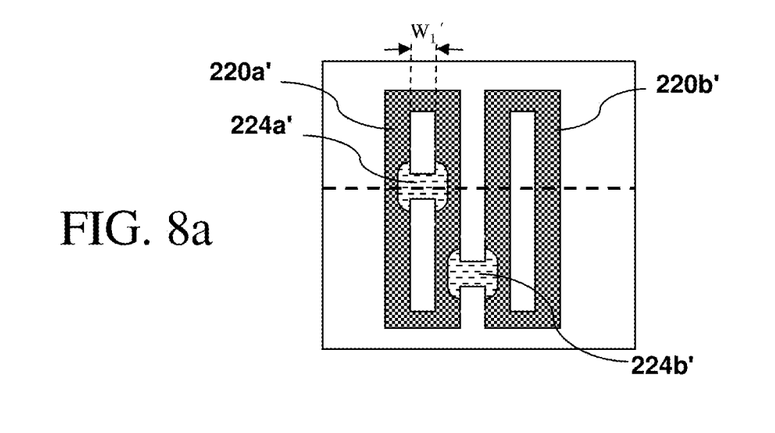
Figure 8B:
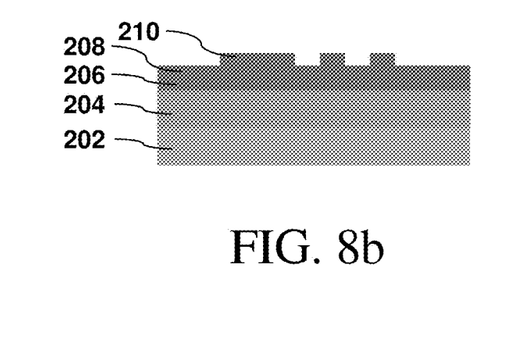
Figure 8C:
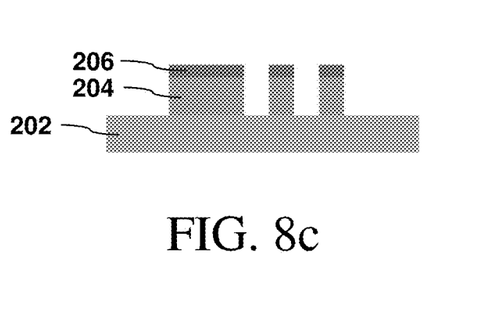

Referring now to FIGS. 8a-8c, in the present embodiment, FIG. 8b shows the spacer features and the cut features being removed via a suitable process, such as a polishing process, leaving the patterned layer 210 on layer 208. FIG. 8c shows the pattern being transferred to the semiconductor substrate 202. This can be done through a suitable process including etching layer 208 with the patterned layer 210 as an etch mask and thereafter removing the patterned layer 210, etching layer 206 with the patterned layer 208 as an etch mask and thereafter removing the patterned layer 208, and etching layer 204 with the patterned layer 206 as an etch mask.

Figure 9A:
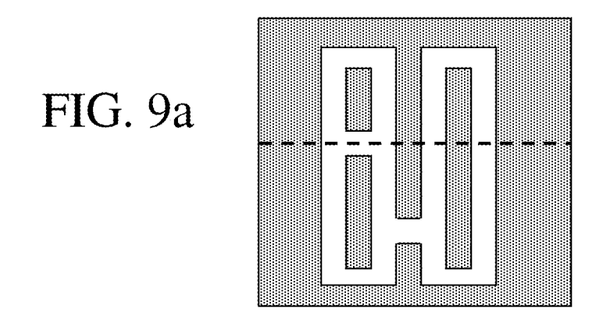
Figure 9B:
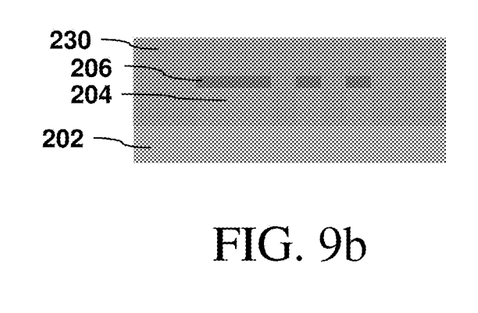
Figure 9C:
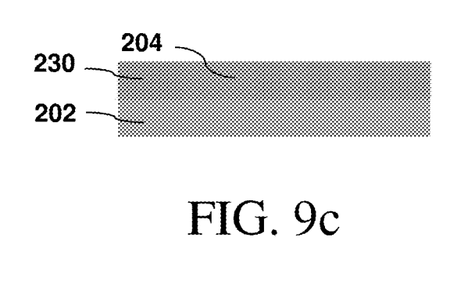

The method 100 proceeds to operation 122 by forming a final pattern or device on the substrate. Referring now to FIGS. 9a-9c, in the present embodiment, a target pattern is to be formed as metal lines in a multilayer interconnection structure. In furtherance of the embodiment, the metal lines are formed in the ILD layer 204. In this case, the operation 120 forms a plurality of trenches in the ILD layer 104. FIG. 9b shows a conductive material 230 being deposited on the dielectric layer 202 and over the patterned layers 204 and 206, filling the trenches with the conductive material, such as a metal. FIG. 9c shows the conductive material being polished (such as by chemical mechanical polishing or CMP) and the patterned layer 206 being removed to expose the patterned ILD layer 204, thereby forming the metal lines in the ILD layer 204.

In another embodiment, a fin field effect transistor (FinFET) structure may be formed on a semiconductor substrate. Fin-like active regions are formed on the semiconductor substrate. In this embodiment, the operation 120 forms a plurality of trenches in the semiconductor substrate. Shallow trench isolation (STI) features are further formed in the trenches by a procedure that includes deposition to fill the trenches with a dielectric material and polishing (such as CMP) to remove excessive dielectric material and planarize the top surface of the semiconductor substrate. Thereafter, a selective etch process is applied to the dielectric material to recess the STI features, thereby forming fin-like active regions.

As thus far illustrated, the present disclosure provides a method of forming a target pattern or device by forming a mandrel pattern on a substrate, reducing dimensions of the mandrel pattern, forming width-tuned spacer features around the mandrel pattern, forming a cut pattern over the mandrel pattern and the spacer features wherein the cut pattern partially overlaps the spacer features, etching the mandrel pattern using the cut pattern as an etch mask, reducing dimensions of the spacer features and the cut pattern, transferring the pattern as defined by the spacer features and the cut pattern to the substrate, and forming the final pattern or device on the substrate. In the above method, the operation of reducing dimensions of the mandrel pattern may be optionally eliminated.

Although not intended to be limiting, an advantage of one or more embodiments of the present disclosure is to keep the conventional spacer process and to fine-tune only the width of the spacer features to extend the overlay budget and CD variation budget of the cut pattern. Also, the cut pattern intercepts the mandrel pattern with reduced CD difference and more desirable angles in the final pattern or device. These advantages are further illustrated below.

Figure 10A:
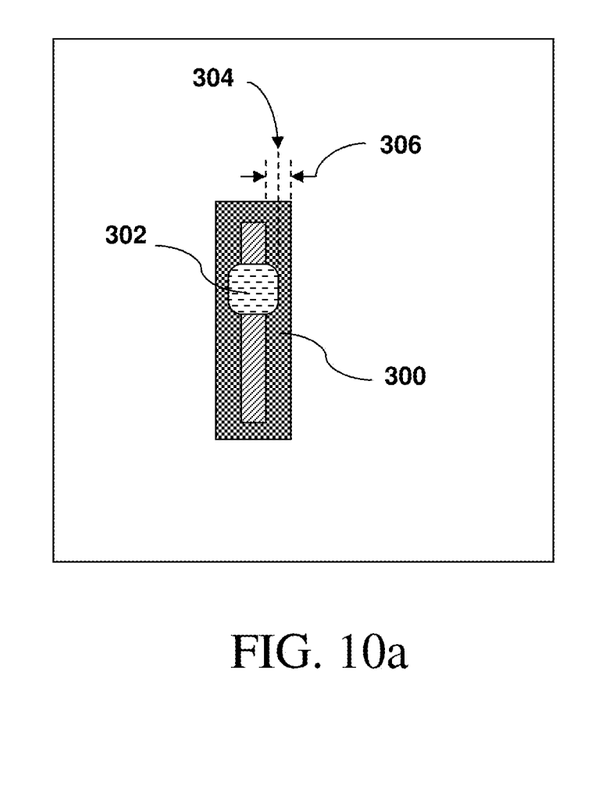
FIGS. 10a, 10b show the Error Budget (EB), where the edge of cut features must reside, with two embodiments.

FIG. 10a shows an embodiment without the spacer width modification. In this embodiment, an error budget (EB) 306 is relatively narrow, in which an edge 304 of a cut feature 302 must reside overlapping a spacer 300. The EB is approximately the same as the width of the spacer 300.

Figure 10B:
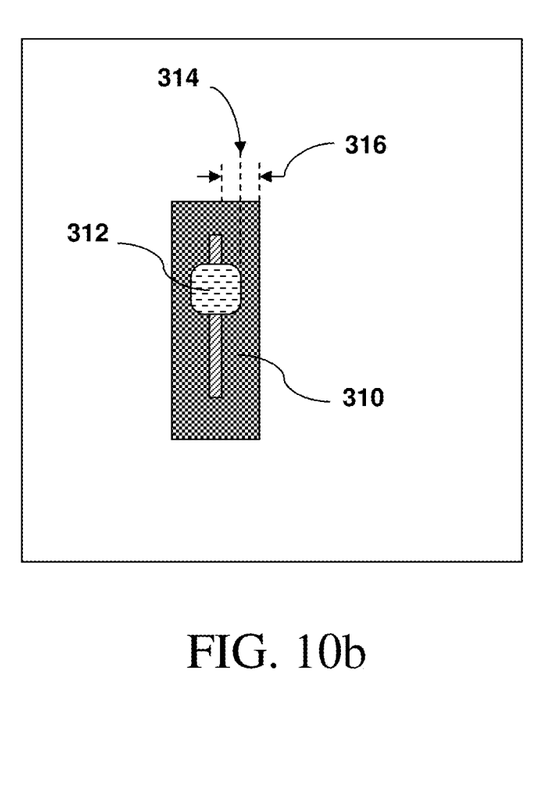

FIG. 10b shows an embodiment consistent with the method 100 in FIG. 1, with the spacer width modification in operation 108. In this embodiment, a spacer 310 is relatively wide, in which an edge 314 of a cut feature 312 must reside, resulting a larger error budget 316, thereby providing a more robust process.

Figure 11A:
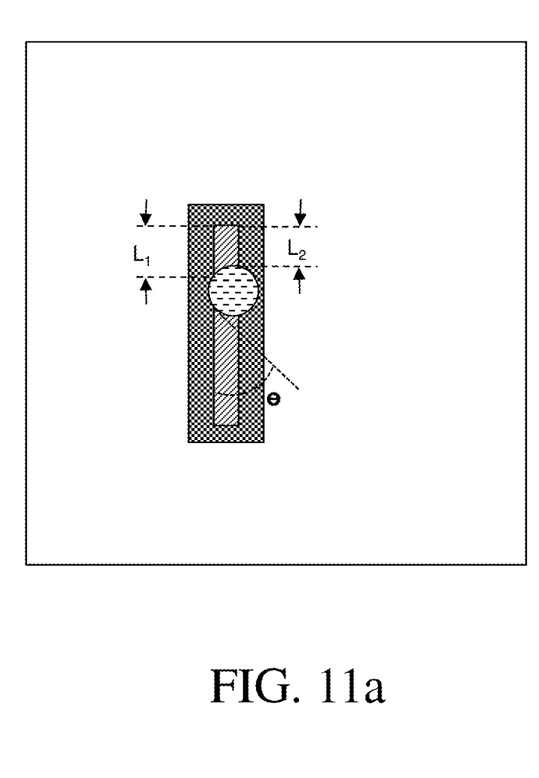
FIGS. 11a, 11b show the acute angles formed between cut pattern and spacer features with two embodiments, as well as the critical dimensions of the final patterns with the two embodiments.

FIG. 11a shows an embodiment, like FIG. 10a above, without the spacer width modification. As can be seen from this figure, when a small cut feature is needed, a combined effect of cut pattern fidelity error and cut pattern offset results in large difference in critical dimensions of the final pattern, e.g., difference between critical dimension $L_1$ and critical dimension $L_2$ in FIG. 11a, and acute angles of the final pattern, e.g., angle θ in FIG. 11a.

Figure 11B:
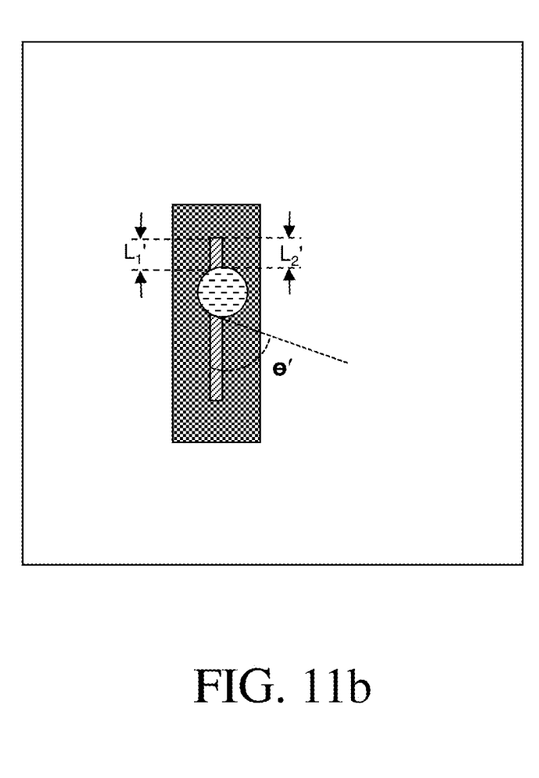

FIG. 11b shows an embodiment, like FIG. 10b above, with spacer width modification according to the method 100 in FIG. 1. Even with cut pattern fidelity error and cut pattern offset, difference in critical dimensions of the final pattern, e.g., difference between critical dimension $L_1'$ and critical dimension $L_2'$ in FIG. 11b, is reduced and acute angles of the final pattern, e.g., angle θ' in FIG. 11b, are depressed, thereby providing a more robust process.

Thus, the present disclosure provides one embodiment of a method of forming a target pattern. The method includes forming a mandrel pattern on a substrate, the mandrel pattern having a line with a first dimension in a first direction and a second dimension in a second direction; forming a spacer around the mandrel pattern, the spacer having a first width; forming a cut pattern over the mandrel pattern and the spacer wherein the cut pattern partially overlaps the spacer on both sides of the line in the first direction; removing at least a portion of the mandrel pattern to define a plurality of openings; and reducing the first width of the spacer thereby to enlarge the plurality of openings.

The present disclosure also provides another embodiment of a method of forming a target pattern. The method includes forming a mandrel pattern on a substrate, the mandrel pattern having a first line and a second line spaced from each other in a first direction wherein the first line has a first dimension in the first direction and a second dimension in the second direction and the second line has a third dimension in the first direction and a fourth dimension in the second direction; reducing the first dimension and the third dimension; forming a first spacer around the first line and a second spacer around the second line thereby defining a gap between the first spacer and the second spacer; forming a cut pattern on the substrate between the first spacer and the second spacer wherein the cut pattern partially overlaps the first spacer and the second spacer; removing the first line and the second line, thereby leaving a first opening within the first spacer and a second opening within the second spacer; and shrinking the first spacer and the second spacer in the first direction, thereby enlarging the gap between the first spacer and the second spacer and enlarging both the first opening and the second opening.

The present disclosure provides another embodiment of a method of forming a target pattern. The method includes forming a mandrel pattern on a substrate, the mandrel pattern having a plurality of lines; forming spacers around the plurality of lines; forming a cut pattern partially overlapping the spacers; etching the mandrel pattern using the cut pattern as an etch mask, thereby defining a plurality of openings with sidewalls of the spacers, the cut pattern, and a portion of the mandrel pattern underneath the cut pattern; and shrinking the spacers and the cut pattern thereby to enlarge the plurality of openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a target pattern for an integrated circuit, the method comprising:
    forming a mandrel pattern on a substrate, the mandrel pattern having a line with a first dimension in a first direction and a second dimension in a second direction;
    forming a spacer around the mandrel pattern, the spacer having a first width;
    forming a cut pattern over the mandrel pattern and the spacer, wherein the cut pattern partially overlaps the spacer on both sides of the line in the first direction;
    removing at least a portion of the mandrel pattern to define a plurality of openings; and
    reducing the first width of the spacer thereby enlarging the plurality of openings.

2. The method of claim 1, further comprising,
    reducing the first dimension of the line before forming the spacer, including etching sidewalls of the line in the first direction.

3. The method of claim 1, wherein forming the spacer around the mandrel pattern includes deposition and an anisotropic etching process.

4. The method of claim 1, wherein the first width of the spacer is at least two and half times greater than the first dimension of the line.

5. The method of claim 1, wherein reducing the first width of the spacer includes etching sidewalls of the spacer.

6. The method of claim 1, further comprising,
    etching sidewalls of both the cut pattern and another portion of the mandrel pattern that is underneath the cut pattern thereby to enlarge the plurality of openings in the second direction.

7. The method of claim 1, further comprising:
    etching the substrate using the spacer and the cut pattern as an etch mask; and
    thereafter removing the spacer, the cut pattern, and another portion of the mandrel pattern that is underneath the cut pattern.

8. A method of forming a target pattern, the method comprising:
    forming a mandrel pattern on a substrate, the mandrel pattern having a first line and a second line spaced from each other in a first direction wherein the first line has a first dimension in the first direction and a second dimension in the second direction and the second line has a third dimension in the first direction and a fourth dimension in the second direction;
    reducing the first dimension and the third dimension;
    forming a first spacer around the first line and a second spacer around the second line thereby defining a gap between the first spacer and the second spacer;
    forming a cut pattern on the substrate between the first spacer and the second spacer wherein the cut pattern partially overlaps the first spacer and the second spacer;
    removing the first line and the second line, thereby leaving a first opening within the first spacer and a second opening within the second spacer; and
    shrinking the first spacer and the second spacer in the first direction, thereby enlarging the gap between the first spacer and the second spacer and enlarging both the first opening and the second opening.

9. The method of claim 8, further comprising, etching sidewalls of the cut pattern in the second direction.

10. The method of claim 8, wherein the shrinking of the first spacer and the second spacer includes etching sidewalls of both the first spacer and the second spacer.

11. The method of claim 8, further comprising:
    forming a material layer on the substrate and within openings defined by the spacer and the cut pattern; and
    thereafter removing the spacer and the cut pattern.

12. A method of forming a target pattern, the method comprising:
    forming a mandrel pattern on a substrate, the mandrel pattern having a plurality of lines;
    forming spacers around the plurality of lines;
    forming a cut pattern partially overlapping the spacers;
    etching the mandrel pattern using the cut pattern as an etch mask, thereby defining a plurality of openings with sidewalls of the spacers, the cut pattern, and a portion of the mandrel pattern underneath the cut pattern; and
    shrinking the spacers and the cut pattern thereby to enlarge the plurality of openings.

13. The method of claim 12, further comprising,
    etching sidewalls of the plurality of lines so as to reduce width of the plurality of lines before forming the spacers.

14. The method of claim 12, wherein:
    the shrinking of the spacers includes etching the sidewalls of the spacers; and
    the shrinking of the cut pattern includes etching sidewalls of both the cut pattern and the portion of the mandrel pattern underneath the cut pattern.

15. The method of claim 12, wherein forming the mandrel pattern includes:
    forming a first material layer on the substrate;
    forming a resist layer on the first material layer;
    patterning the resist layer;
    etching the first material layer using the patterned resist layer as an etch mask; and
    thereafter removing the patterned resist layer.

16. The method of claim 12, wherein forming the spacers includes:
    depositing a spacer material over the plurality of lines and on the substrate; and
    applying an anisotropic etching process to the spacer material;
    wherein the anisotropic etching process includes plasma etching.

17. The method of claim 12, wherein forming the cut pattern includes:
    forming a third material layer over the mandrel pattern and the spacers on the substrate;
    forming a fourth material layer over the third material layer;
    forming a resist layer on the fourth material layer;
    patterning the resist layer;
    etching the fourth material layer using the patterned resist layer as an etch mask;
    removing the patterned resist layer; and
    etching the third material layer using the patterned fourth material layer as an etch mask thereby to expose the substrate.

18. The method of claim 17, wherein:

the substrate material includes one of: silicon oxide, silicon oxygen carbide, and plasma enhanced chemical vapor deposited silicon oxide;

the mandrel pattern uses a bottom anti-reflective coating polymeric material;

the spacer material includes one of: titanium nitride, silicon nitride, and titanium oxide;

the third material includes a bottom anti-reflective coating polymeric material;

the fourth material includes silicon containing polymer; and the etching of the third material layer includes a process selectively tuned to remove the third material layer and the mandrel pattern using the patterned fourth material layer as an etch mask while the spacers remain.

19. The method of claim 12, further comprising:

etching the substrate using the spacers and the cut pattern as an etch mask; and thereafter removing the spacers, the cut pattern, and the portion of the mandrel pattern underneath the cut pattern.

20. The method of claim 19, further comprising, forming conductive lines over the substrate using a process including a deposition process and a polishing process, wherein:

the substrate includes an inter-layer dielectric layer over a dielectric layer;

the etching of the substrate includes etching the inter-layer dielectric layer thereby forming trenches in the inter-layer dielectric layer;

the deposition process includes filling the trenches with a conductive material; and the polishing process includes a chemical mechanical polishing process.

* * * * *